United States Patent
Neal et al.

(10) Patent No.: US 11,542,593 B2
(45) Date of Patent: *Jan. 3, 2023

(54) NANOPARTICLE FORMATION MITIGATION IN A DEPOSITION PROCESS

(71) Applicant: Raytheon Technologies Corporation, Farmington, CT (US)

(72) Inventors: James W. Neal, Jupiter, FL (US); Brian T. Hazel, Avon, CT (US); David A. Litton, West Hartford, CT (US); Eric Jorzik, Annville, PA (US)

(73) Assignee: Raytheon Technologies Corporation, Farmington, CT (US)

( * ) Notice: Subject to any disclaimer, the term of this patent is extended or adjusted under 35 U.S.C. 154(b) by 180 days.

This patent is subject to a terminal disclaimer.

(21) Appl. No.: 16/919,569

(22) Filed: Jul. 2, 2020

(65) Prior Publication Data

US 2020/0332409 A1    Oct. 22, 2020

Related U.S. Application Data

(62) Division of application No. 14/920,081, filed on Oct. 22, 2015, now Pat. No. 10,704,135.

(60) Provisional application No. 62/068,122, filed on Oct. 24, 2014.

(51) Int. Cl.
*C23C 14/30* (2006.01)
*C23C 14/56* (2006.01)
*C23C 14/54* (2006.01)

(52) U.S. Cl.
CPC .............. *C23C 14/30* (2013.01); *C23C 14/54* (2013.01); *C23C 14/564* (2013.01)

(58) Field of Classification Search
None
See application file for complete search history.

(56) References Cited

U.S. PATENT DOCUMENTS

| | | | |
|---|---|---|---|
| 4,526,132 A | 7/1985 | Ohta | |
| 5,736,073 A | 4/1998 | Wadley et al. | |
| 6,641,511 B2 | 11/2003 | Patel et al. | |
| 8,349,086 B2 | 1/2013 | Bernaski et al. | |
| 8,603,582 B2 | 12/2013 | Bernaski et al. | |
| 10,704,135 B2 * | 7/2020 | Neal | C23C 14/30 |
| 2004/0134430 A1 | 7/2004 | Hass et al. | |
| 2004/0211363 A1 | 10/2004 | Bruce et al. | |
| 2005/0084654 A1 | 4/2005 | Takahashi et al. | |
| 2008/0223725 A1 | 9/2008 | Han et al. | |
| 2010/0189929 A1 | 7/2010 | Neal et al. | |
| 2010/0247809 A1 | 9/2010 | Neal | |
| 2012/0196030 A1 | 8/2012 | Neal et al. | |

(Continued)

FOREIGN PATENT DOCUMENTS

| | | |
|---|---|---|
| JP | S5814329 A | 1/1983 |
| JP | 2000124137 A | 4/2000 |
| WO | 2014144189 A1 | 9/2014 |

OTHER PUBLICATIONS

European Office Action dated Nov. 20, 2017 issued for European Patent Application No. 15190417.4.

*Primary Examiner* — Karla A Moore
(74) *Attorney, Agent, or Firm* — Bachman & LaPointe, P.C.

(57) ABSTRACT

A system for depositing coating on a workpiece includes a deposition chamber within which is formed a vortex to at least partially surround a workpiece therein.

7 Claims, 2 Drawing Sheets

(56) References Cited

U.S. PATENT DOCUMENTS

Figure 1:
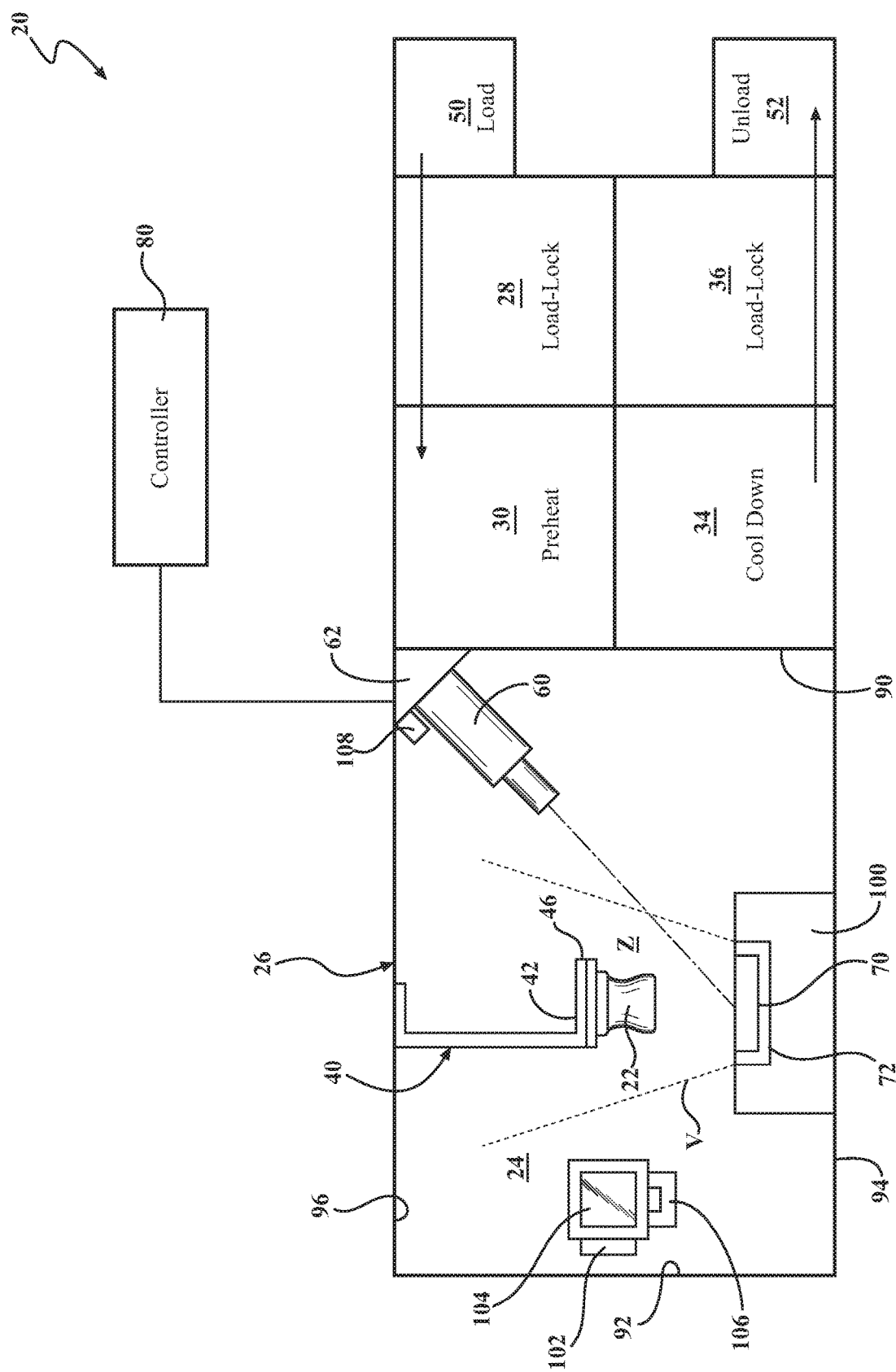

| | | | |
|---|---|---|---|
| 2012/0282402 A1 | 11/2012 | Neal et al. | |
| 2016/0115584 A1* | 4/2016 | Neal | C23C 14/30 |
| | | | 118/715 |
| 2016/0333465 A1* | 11/2016 | Trubelja | C23C 14/243 |
| 2019/0040525 A1* | 2/2019 | Trubelja | C23C 14/243 |

* cited by examiner

NANOPARTICLE FORMATION MITIGATION IN A DEPOSITION PROCESS

CROSS REFERENCE TO RELATED APPLICATION

This application is a divisional of U.S. patent application Ser. No. 14/920,081, filed Oct. 22, 2015, which claims the benefit of provisional application Ser. No. 62/068,122, filed Oct. 24, 2014.

BACKGROUND

The present disclosure relates to electron beam physical vapor deposition, and more particularly, to nanoparticle or "fluff" mitigation.

Electron Beam Physical Vapor Deposition (EBPVD) is a form of physical vapor deposition in which a target material is bombarded with an electron beam given off by a charged tungsten filament under high vacuum. The electron beam causes atoms from the target to transform into the gaseous phase. These atoms then condense into solid form, coating a workpiece in the vacuum chamber, and within a line of sight, with a thin layer of the material.

Running the EB-PVD process under lower vacuum (higher pressure) conditions results in faster deposition rates and improved coating of surfaces with limited line-of-sight to the targets that generate the vapor flux. However, nanoparticle formation can occur under these conditions, likely due to condensation of vapor in the gas phase. These nanoparticles can have several undesirable effects, including clogging or damage of pumping systems, accumulation in and damage to the electron beam gun systems, and obscuring of viewports. Mitigations of these effects is necessary for an economic, operationally efficient coating process.

SUMMARY

A system for depositing coating on a workpiece according to one disclosed non-limiting embodiment of the present disclosure includes a deposition chamber including at least one wall with a thermal barrier coating.

A further embodiment of the present disclosure includes, wherein a gas pressure within the deposition chamber is about 10 Pa.

A further embodiment of any of the foregoing embodiments of the present disclosure includes, wherein the gas pressure provides an about 0.5 Pa pressure drop via a vortex that at least partially surrounds a workpiece within the deposition chamber.

A further embodiment of any of the foregoing embodiments of the present disclosure includes, wherein a gas temperature within the deposition chamber is at least about 1300 F (704 C).

A further embodiment of any of the foregoing embodiments of the present disclosure includes, wherein the gas temperature is provided via an electron beam gun.

A further embodiment of any of the foregoing embodiments of the present disclosure includes, wherein every wall of the deposition chamber includes the thermal barrier coating.

A further embodiment of any of the foregoing embodiments of the present disclosure includes, wherein the thermal barrier coating is Zirconium Oxide ($ZrO_2$).

A system for depositing coating on a workpiece according to one disclosed non-limiting embodiment of the present disclosure includes a deposition chamber within which a gas temperature is at least about 1300 F (704 C).

A further embodiment of any of the foregoing embodiments of the present disclosure includes, wherein a gas pressure within the deposition chamber is about 10 Pa.

A further embodiment of any of the foregoing embodiments of the present disclosure includes, wherein the gas pressure provides an about 0.5 Pa pressure drop.

A further embodiment of any of the foregoing embodiments of the present disclosure includes, wherein the gas temperature is provided via an electron beam gun.

A further embodiment of any of the foregoing embodiments of the present disclosure includes, wherein the deposition chamber includes at least one wall with a thermal barrier coating.

A further embodiment of any of the foregoing embodiments of the present disclosure includes, wherein the thermal barrier coating is Zirconium Oxide ($ZrO_2$).

A further embodiment of any of the foregoing embodiments of the present disclosure includes forming a vortex within the deposition chamber.

A method of Electron Beam Physical Vapor Deposition according to one disclosed non-limiting embodiment of the present disclosure includes preheating process gasses within the deposition chamber to about a deposition temperature to counteract a condensation phenomenon.

A further embodiment of any of the foregoing embodiments of the present disclosure includes maintaining a gas temperature within the deposition chamber at about 1400 F-2000 F (760 C-1093 C).

A further embodiment of any of the foregoing embodiments of the present disclosure includes injecting the process gases through a manifold.

A further embodiment of any of the foregoing embodiments of the present disclosure includes maintaining the gas temperature within the deposition chamber via a wall with a thermal barrier coating.

A further embodiment of any of the foregoing embodiments of the present disclosure includes forming a vortex within the deposition chamber.

A further embodiment of any of the foregoing embodiments of the present disclosure includes, wherein a gas pressure within the deposition chamber is about 10 Pa with an about 0.5 Pa pressure drop via the vortex.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows:

FIG. 1 is a partially schematic view of a deposition system; and

FIG. 2 is a schematic view of the deposition chamber.

DETAILED DESCRIPTION

FIG. 1 schematically illustrates a system 20 for depositing coating on workpieces 22 in the interior 24 of a deposition or coating chamber 26. The system 20 passes the workpieces 22 downstream along a workpiece flowpath sequentially through a first load lock chamber 28 forming an in-feed chamber, a preheat chamber 30, the deposition chamber 26, a cooldown chamber 34, and a second load lock chamber 36.

Workpieces are carried through the system on a part holder 40. Depending upon implementation, an individual fixture may hold a single workpiece or multiple workpieces. In the deposition chamber 26, the workpieces may be manipulated by a sting mechanism 42. In this example, a loading station 50 and an unloading station 52 are schematically illustrated. These may include robots (e.g., six-axis industrial robots) to transfer fixtured workpieces from and to conveyors, pallets, and the like.

The exemplary deposition chamber 26 is configured for electron beam physical vapor deposition (EB-PVD). In this example, at least one electron beam (EB) gun 60 is positioned to direct its beam to one or more deposition material sources 70, 72. In this example, there are two distinct ingots 70, 72 of different materials. The ingots may be ceramics of different composition for forming distinct layers in a thermal barrier coating, erosion coating, abradable coating, or abrasive coating. For example, Zirconia-based ingot examples include, but are not limited to, a yttria-stabilized zirconia (YSZ) such as 7YSZ, a gadolinia-stabilized zirconia, or a YSZ of different yttria content or dopant. A part manipulator 46 may be used to position the workpiece(s) 22 in distinct positions, or sets of positions, associated with deposition from the two distinct sources, e.g., generally above the respective ingots so as to be approximately centrally positioned in a resulting vapor plume V.

In one exemplary implementation, a single electron beam gun 60 is positioned to raster both ingots and may be coupled to a control system 80 to sequentially heat the two sources for the two stages of deposition—or more stages if more than two layers are involved. With the exemplary deposition chamber 26, both the preheat chamber 30 and the cooldown chamber 34 are arranged along a first side wall 90 of the deposition chamber 26. The deposition chamber has a second side wall 92 opposite the first side wall 90, a bottom wall 94, and an upper wall 96.

The exemplary EB gun 60 is positioned along a junction of the upper wall 96 and the side wall 90 so as to diagonally point toward a thermal tray 100 containing the ingots 70, 72. In one example, a trajectory of primary particle residence time is about 0.1 seconds; a mean free path from the EB gun 60 is about 0.005 cm; and an oxygen turnover time is about 0.5 seconds.

The deposition chamber 26 may further include gas purges 102 with $O_2$ and/or Ar gases, that may be located in one or more viewports 104. A stroboscope 106 may be located adjacent to the viewport 104 to prevent obscuring thereof. Further, a gas shower 108 may be directed from a compartment 62 for the EB gun 60 into the deposition chamber 26, with gas flows ranging from 0.1 to 2 slpm. Gas showers of $O_2$ and/or Ar as well as gas purges of the compartment 62, with $O_2$, Ar, $N_2$, air, and/or mixtures thereof avoid ingress of nanoparticles. It should be appreciated that various other purges may alternatively or additionally be provided.

Figure 2:
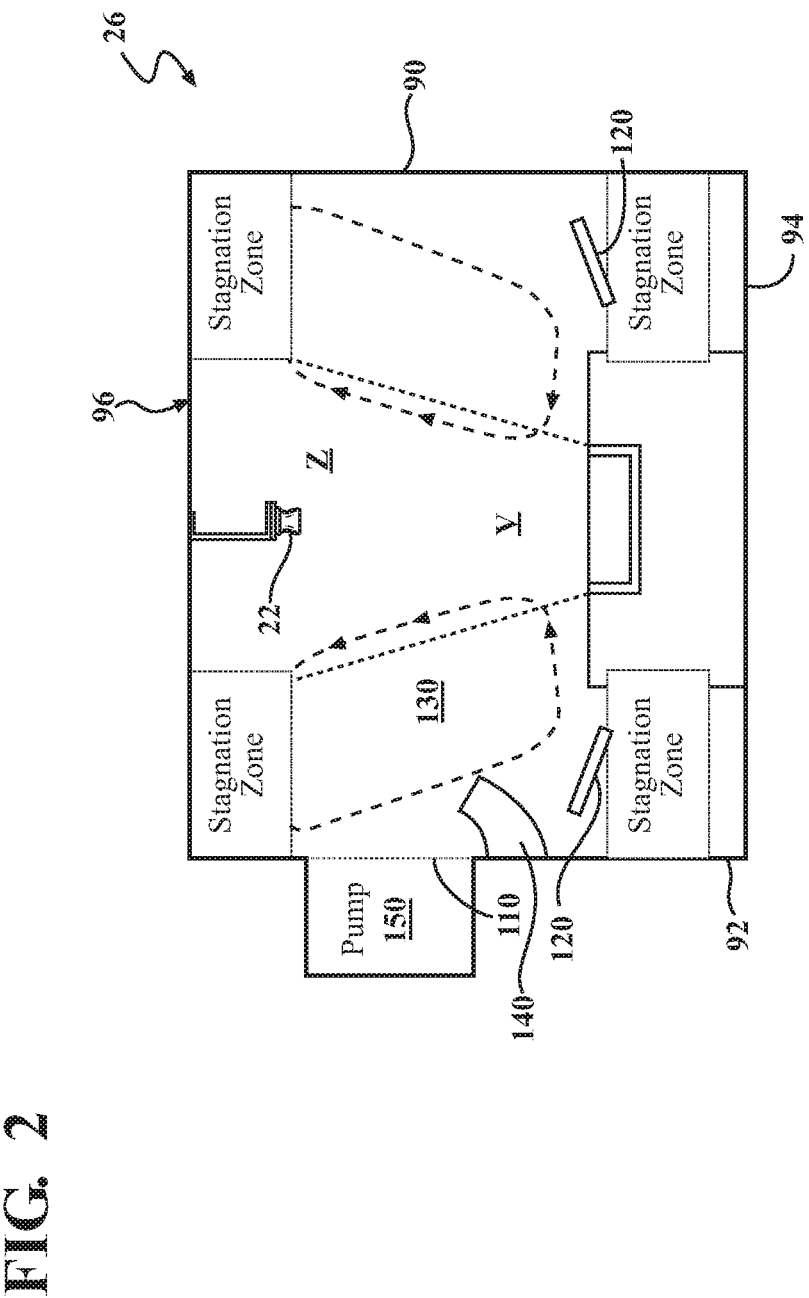

With reference to FIG. 2, in operation, the deposition chamber 26 operates at a relatively high speed so that workpieces 22 can be coated in less time than the required pre-heat time and cool down time. Physics modeling supports low vacuum operation (LVO) of the EB-PVD process that compresses the vapor stream V. The gas injection to provide LVO also facilitates generation of vapor stream/gas vortices that allow condensation of the vapor into nanoparticles outside of the vapor stream V which results in agglomeration of nanoparticles, and their deposition, in stagnant and cold areas of the deposition chamber 26, such as, for example, mechanical pump screens 110. Fluff formation is thus essentially a condensation phenomenon such that supplemental heat, or redistribution of process heat, can facilitate the prevention of fluff formation.

In one disclosed non-limiting embodiment, to counteract this condensation phenomenon, the process gasses are preheated to near deposition temperature. For example, a portion of the EB gun 60 power is utilized to heat refractory plates 120 in the stagnant and vortex areas to reducing heat transfer to the relatively cold walls 90-94 early in the coating campaign to minimize—if not eliminates—fluff formation. In this example, the EB gun 60 may be operated at a higher power to increase temperatures within the deposition chamber 26. In another example, the cooling of the deposition chamber walls is reduced. In still another example, a thermal barrier coating such as Zirconium Oxide ($ZrO_2$) is provided on the walls of the deposition chamber 26.

In this disclosed non-limiting embodiment, the gas temperature in the deposition chamber 26 is about 1300 F (704 C) such that the temperature of the walls 90-94 themselves facilitate the prevention of fluff formation. Densification time of an example 5 nm particles is −0.01 s at 1300 F (704 C) (sufficient for formation of large dense particles) and 3 hrs at 1000 F (fluff formation). A temperature change of about 100 F (38 C) thus results in a change of densification time of 2 orders of magnitude such that coalescence of the particles is about 1000 times faster. Increasing gas temperature increase the positive effect of fluff reduction, and it has been determined that an injected gas temperatures of 1400 F-2000 F (760 C-1093 C) may be sufficient to minimize the fluff formation to manageable levels.

In another disclosed non-limiting embodiment, to counteract this condensation phenomenon, a vortex 130 is formed within the deposition chamber 26 around the vapor plume, V, to separate particles smaller than about 2.5 nm. The vortex 130 provides a gas pressure of about 10 Pa with low, e.g., about 0.5 Pa pressure drop. To grow to 1 mm size, an approximately 40 second residence time of the particle in the stagnated zone is required, while maximal particle size in the vortex 130 at low vacuum is approximately 3 nm such that gravitation escapes the relatively large particles of about 1 mm particles from the stagnated zones. Large particles are typically located only at the walls 90-94 of the deposition chamber 26.

In one example, primary particles with a diameter less than about 1 um can be separated by the vortex 130. Separation of the particles larger than about 1 um by an electrical field under EB PVD conditions is not possible while separation of particles smaller than about 3 nm is questionable because of the particle fraction that is uncharged.

In another disclosed non-limiting embodiment, to counteract this condensation phenomenon, the process gases injected to enable LVO are injected in a manner that minimizes interaction between the process gas and the vapor plume, V, while still providing the desired background pressure in the deposition chamber 26 that compresses the vapor plume, V, to enable the benefits of LVO. This facilitates deposition of the vapor on the workpieces 22, prior to significant interaction with the relatively colder process gas, thus reducing the occurrence of the condensation phenomenon. This can be facilitated by introducing the process gas through manifolds 140 that are arranged such that the process gas does not flow through a volume of the coating chamber between the ingots 70, 72, the workpiece 22, and the upper wall 96, or thermal hood, above the workpieces, heretofore referred to as the "coating zone" "Z". An exemplary implementation of this approach is to inject the process gases directly into a pump plenum at the exit of the process chamber 26, downstream of the coating zone Z. This approach facilitates increased pressure in the coating zone Z that will contain a higher partial pressure of vapor molecules, and thus a lower partial pressure of process gas molecules. Since the vapor molecules are already heated, collisions between vapor molecules are less likely to result in condensation of nanoparticles. Thus, this interaction approach minimizes the need to heat the process gases, thereby increasing the efficiency of the process.

In another disclosed non-limiting embodiment, to counteract this condensation phenomenon, the process gases injected to enable LVO are injected via a manifold 140 that directs the flow upward toward the upper wall 96. In this embodiment, since the direction of the velocity vector of the process gas is similar to that of the vapor molecules, collisions between the process gas and the vapor do not result in significant reduction of velocity of the vapor molecules, so the vapor molecules are not cooled significantly by the collisions. One example would locate the process gas manifold 140 between the coating zone and the exit from the process chamber 26 into the pumping plenum 150 with the manifold facing upward toward the upper wall 96.

The use of the terms "a," "an," "the," and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A method of Electron Beam Physical Vapor Deposition, comprising:
   injecting process gases through a manifold that directs the process gases upward toward an upper wall of a deposition chamber forming a vortex within the deposition chamber around a vapor plume from an ingot, the vapor plume generated by an electron beam gun directed toward the ingot;
   preheating the process gases via operation of the electron beam gun within the deposition chamber to a deposition temperature; and
   maintaining a gas temperature within the deposition chamber at greater than 1300 F (704 C) via continued operation of the electron beam gun within the deposition chamber.

2. The method as recited in claim 1, further comprising maintaining the gas temperature within the deposition chamber at about 1400 F-2000 F (760 C-1093 C).

3. The system as recited in claim 1, wherein the deposition chamber has a wall with a thermal barrier coating.

4. The method as recited in claim 1, further comprising forming the vortex within the deposition chamber around the vapor plume to separate particles smaller than about 2.5 nm.

5. The method as recited in claim 4, wherein a gas pressure within said deposition chamber is about 10 Pa with an about 0.5 Pa pressure drop via the vortex.

6. A method of Electron Beam Physical Vapor Deposition, comprising:
   injecting process gases thorough a manifold that directs the process gases upward toward an upper wall of a deposition chamber forming a vortex within the deposition chamber around a vapor plume from an ingot, the vapor plume generated by an electron beam gun directed toward the ingot; and
   preheating the process gases via operation of the electron beam gun within the deposition chamber to a deposition temperature.

7. A method of Electron Beam Physical Vapor Deposition, comprising:
   injecting process gases thorough a manifold that directs the process gases upward toward an upper wall of a deposition chamber forming a vortex within the deposition chamber around a vapor plume from an ingot, the vapor plume generated by an electron beam gun directed toward the ingot; and
   maintaining a gas temperature within the deposition chamber at great than 1300 F (704 C) via continued operation of the electron beam gun within the deposition chamber.

* * * * *